United States Patent [19]
Jones et al.

[11] Patent Number: 5,313,503
[45] Date of Patent: May 17, 1994

[54] PROGRAMMABLE HIGH SPEED DIGITAL PHASE LOCKED LOOP

[75] Inventors: Timothy D. Jones, Kingston; Peter P. Klinger, Wappingers Falls, both of N.Y.

[73] Assignee: International Business Machines Corporation, Armonk, N.Y.

[21] Appl. No.: 904,360

[22] Filed: Jun. 25, 1992

[51] Int. Cl.⁵ .............................................. H03D 3/24
[52] U.S. Cl. .................................... 375/120; 331/25; 331/17; 331/32; 307/521
[58] Field of Search ................. 375/119, 120; 331/17, 331/34, 47, 48, 25; 307/521

[56] References Cited

U.S. PATENT DOCUMENTS

| | | | |
|---|---|---|---|
| 4,052,673 | 10/1977 | Herzog | 325/153 |
| 4,531,223 | 7/1985 | Ashida | 375/110 |
| 4,626,798 | 12/1986 | Fried | 331/1 |
| 4,677,648 | 6/1987 | Zurfluh | 375/120 |
| 4,847,879 | 7/1989 | Iijima et al. | 377/43 |
| 4,885,553 | 12/1989 | Hietala et al. | 331/17 |
| 4,920,320 | 4/1990 | Matthews | 331/17 |
| 4,972,444 | 11/1990 | Melrose et al. | 375/120 |
| 4,988,960 | 1/1991 | Tomisawa | 332/127 |
| 5,022,056 | 6/1991 | Henderson et al. | 375/119 |
| 5,068,628 | 11/1991 | Ghoshal | 331/1 A |
| 5,075,640 | 12/1991 | Miyazawa | 331/10 |

FOREIGN PATENT DOCUMENTS 0475468 3/1992 European Pat. Off. .

Primary Examiner—Stephen Chin
Assistant Examiner—Amanda T. Le
Attorney, Agent, or Firm—Lawrence D. Cutter

[57] ABSTRACT

An improved digital phase locked loop (DPLL) has a fixed bandwidth independent of manufacturing and environmental variations. The DPLL bandwidth is optimized by monitoring the delay propagation, i.e., the "silicon speed", of the module. This information is used by a bandwidth regulator to control the characteristics of the low pass filter in the phase locked loop. The digital phase locked loop is also programmable to allow the user to control the phase shifting of the retiming clock. A phase shift control for a second, slave controlled oscillator is used to retime the received data. This phase shift control allows the user to control the phase shifting of a retiming latch.

12 Claims, 5 Drawing Sheets

PROGRAMMABLE HIGH SPEED DIGITAL PHASE LOCKED LOOP

BACKGROUND OF THE INVENTION

1. Field of the Invention

The present invention generally relates to digital communication systems employing phase locked loops (PLLs) and, more particularly, to an improved high speed digital phase locked loop (DPLL) which has a fixed bandwidth independent of variations in manufacturing process or environment and which is programmable to allow user control of phase shifting of the retiming clock.

2. Description of the Prior Art

Digital communication systems provide links not only between various digital devices such as computers connected in a network but also in more traditional electronic communications as well. For example, the next generation of cellular telephone systems will be digital, and proposals for an all digital high definition television standard are currently under review. In all applications, it is important to minimize the jitter rate of the received pulses and thereby substantially reduce the bit error rate (BER) of a received digital transmission.

Traditionally, phase locked loops (PLLs) have been used for precise tuning in communications systems. The principles of the PLL have been applied to digital communication systems in the form of a digital phase locked loop (DPLL) manufactured as an integrated circuit (IC) on a silicon substrate. The manufacturing process may introduce subtle variations in DPLL chips. In sequential digital logic design, timing variations do not alter the function of a module. As long as set up and hold times are met, the design is indifferent to propagation delay through the elements. However, performance characteristics of high speed digital phase locked loops (DPLLs) using tapped delay lines are greatly affected by propagation delays. When considering manufacturing and environmental variations, it is not uncommon to observe a three fold variation between best case and worst case propagation delays.

As process variations are encountered for these DPLLs, the performance characteristics change. More specifically, the bandwidth of the loop changes. This can degrade the performance of the device by creating a higher than acceptable bit error rate (BER) in data transmission systems. In the analog domain, these variations are accounted for by using adjustable components, like potentiometers and variable capacitors. With DPLLs, a new technique must be used.

U.S. Pat. No. 4,626,798 to Fried discloses a phase locked loop wherein the frequency of the ring oscillator in the PLL is adjusted by controlling the number of delay elements in the ring. Fried employs analog circuitry for this control and, therefore, his approach is not easily implemented using very large scale integration (VLSI) techniques. A similar approach was taken by Herzog in U.S. Pat. No. 4,052,673. U.S. Pat. Nos. 4,677,648 to Zurfluh and 4,972,444 to Melrose et al. disclose the use of delay lines used in DPLLs. These designs rely on non-return to zero (NRZ) code and have fixed low pass filter elements. For those applications where there is no stringent jitter transfer requirement, the DPLLs of Zurfluh and Melrose et al. are adequate. However, for those applications where jitter transfer must be critically minimized, what is needed is a 100% digital design which is absolutely stable and suitable for VLSI fabrication.

SUMMARY OF THE INVENTION

It is therefore an object of the present invention to provide an improved digital phase locked loop having fixed bandwidth independent of manufacturing and environmental variations.

It is another object of the invention to provide a digital phase locked loop which is programmable to allow the user to control the phase shifting of the retiming clock.

According to the present invention, the DPLL bandwidth is optimized by monitoring the delay propagation, i.e., the "silicon speed", of the module. This information is used by a bandwidth regulator to control the characteristics of the low pass filter in the phase locked loop. The invention also provides a phase shift control for a second, slave controlled oscillator which is used to retime the received data. This phase shift control allows the user to control the phase shifting of a retiming latch.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
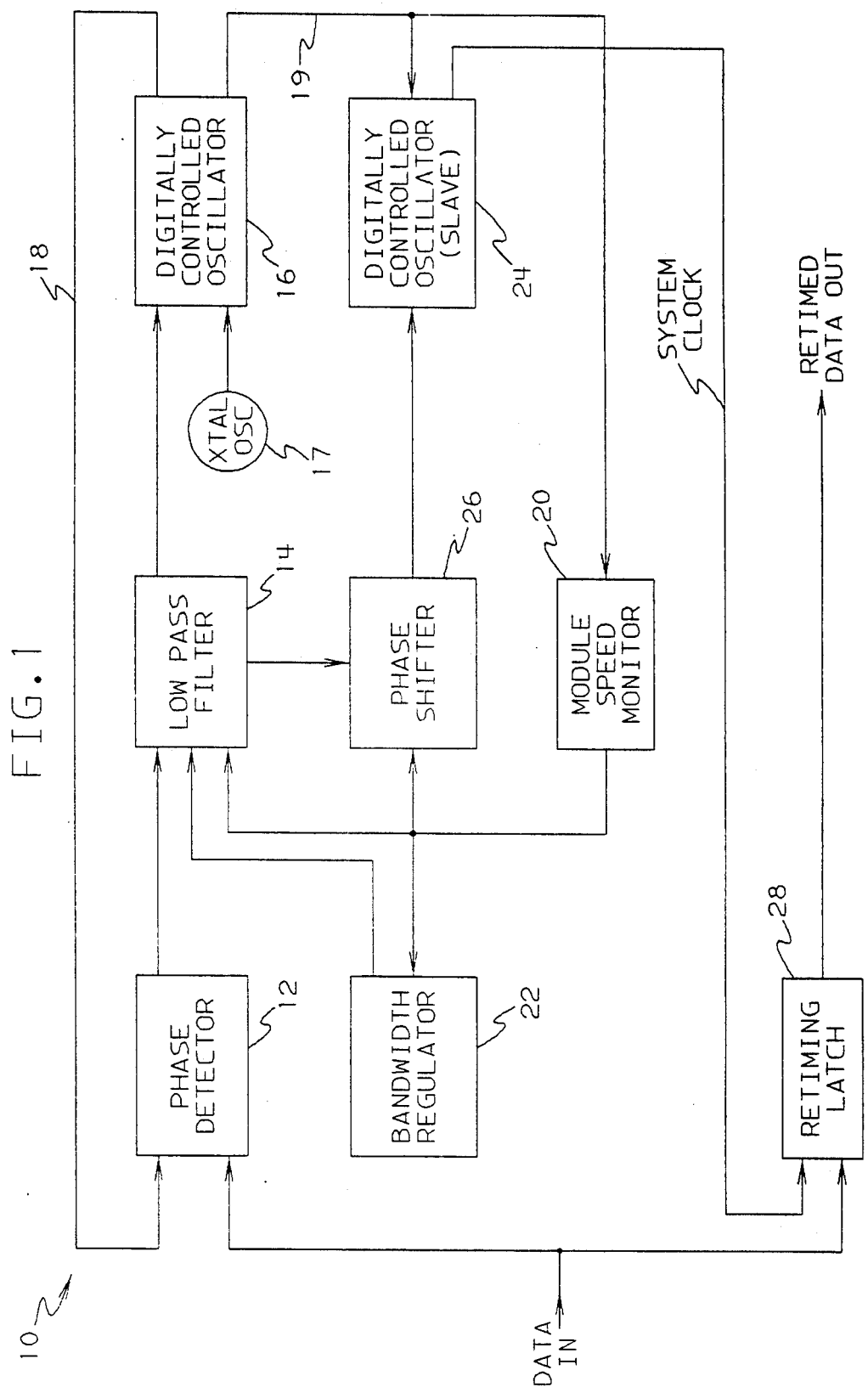
FIG. 1 is a block diagram showing an overview of the digital phase locked loop (DPLL) with bandwidth regulator and phase shifter according to the invention.

Referring now to the drawings, and more particularly to FIG. 1, there is shown in block diagram form the overall design of the digital phase locked loop (DPLL) 10 according to the invention. Similar to the classic second order PLL which requires at least one phase detector, a low pass filter, and a voltage controlled oscillator (VCO), the DPLL includes a phase detector 12, which receives input data, a low pass filter 14 which filters the output of the phase detector 12, and a digitally controlled oscillator (DCO) 16 which receives a precision frequency reference from crystal oscillator 17 and generates a clock signal on line 18 which is fedback to the phase detector 12.

The present invention optimizes the performance of the DPLL by addressing two features of this basic design. First, the invention optimizes the DPLL bandwidth by making it independent of the manufacturing process and temperature and power variations. Second, a phase shift control is provided to allow the user to control the phase shifting of a retiming latch.

Figure 2:
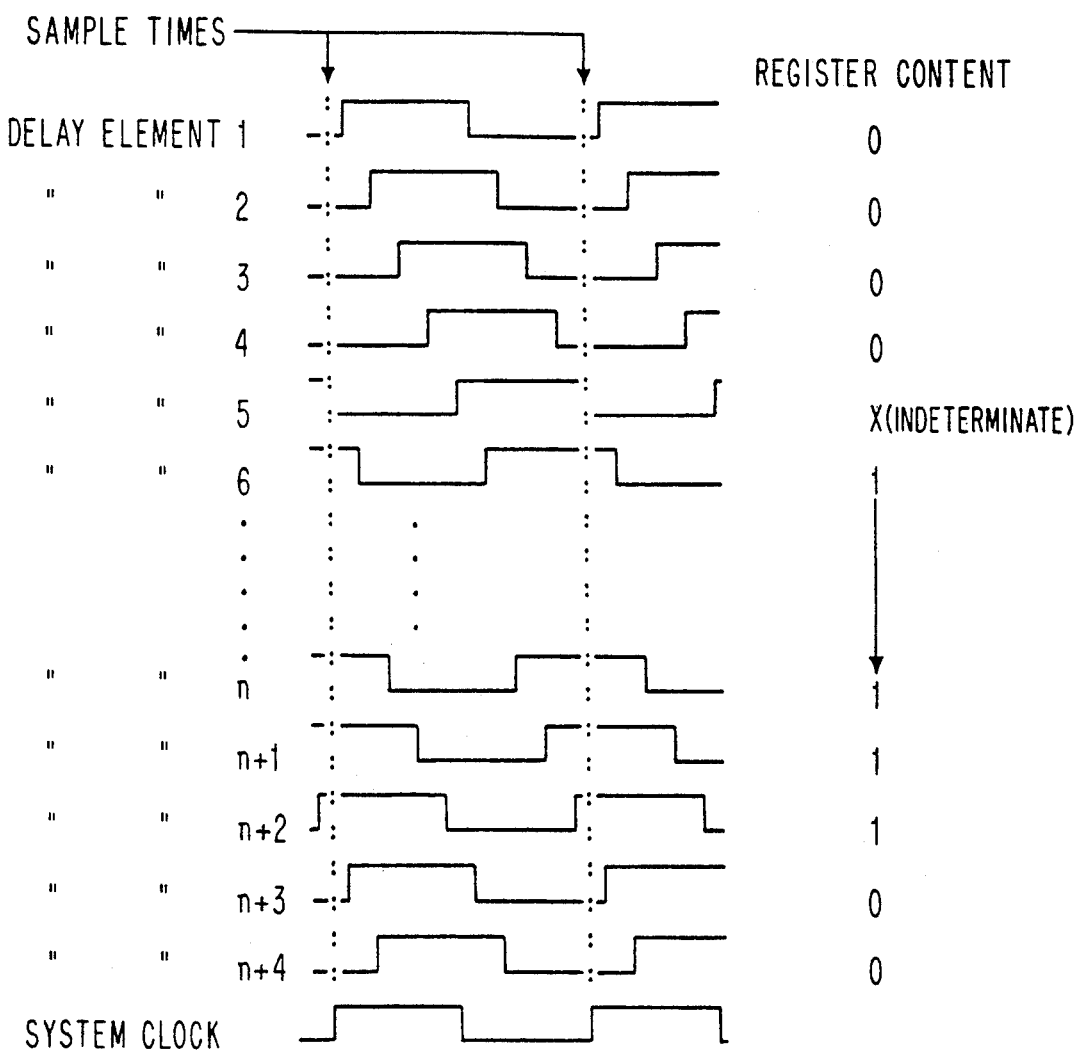
FIG. 2 is a timing diagram showing a delay element snapshot as made by the module speed monitor in the DPLL shown in FIG. 1.

In order to achieve the optimized bandwidth, the DPLL must know the propagation delay through the logic gates. This is referred to as the "silicon speed" of the module and is determined by the module speed monitor 20 connected to delay string bus 19. The monitor uses this information to adjust the low pass filter characteristics of low pass filter 14. The "speed" indicator is also used to determine the last delay element to use for phase corrections. As the speed of the silicon changes, the number of delay elements required to span a clock cycle changes. The module speed monitor 20 takes snapshots of a delay string or ring oscillator and determines the number of delay elements required to span one full clock period. This is done with the aid of the clock that is running close to the received data rate and a plurality of latches connected to corresponding delay elements in a delay string. The latches asynchronously latch delayed versions of the delay string thereby creating a large register string of binary "1's" and "0's" as shown in FIG. 2. For the register contents $0000 \times 1 \ldots 11100$ shown in FIG. 2, for example, it takes $n+2$ delay elements to span one clock period. Monitoring a ring oscillator would require multiple snapshots and additional computation. This information is encoded and sent to the low pass filter 14 so that it can determine how many delay elements to use in the delay string or ring oscillator forming the DCO 16. In addition, the information is also sent to a bandwidth regulator 22 which converts the values dynamically and then feeds it to another section on the low pass filter 14 so that the loop dynamics can be adjusted.

The low pass filter 14 regulates the speed of the DPLL by telling the DCO 16 when to make a phase adjustment. The phase detector 12 provides lag/lead information which is fed to an up/down counter in the low pass filter 14. When the up/down counter reaches a limit or threshold as determined by the bandwidth regulator 22, the low pass filter causes the DCO 16 to make a phase adjustment. This phase adjustment is made in delay strings by selecting a new delay element. For the implementation of the DCO 16 as a ring oscillator, this is done by adding or subtracting a delay element to the ring momentarily.

In order for the loop to have a fixed bandwidth, the bandwidth regulator must adjust the low pass filter counter threshold dynamically. The simplest translation would be to select one threshold value for delay sizes greater than a predefined value and another threshold value for delay sizes less than the predefined value. This approach minimizes hardware requirements but does not perfectly optimize bandwidth. Therefore, the preferred embodiment of the invention employs a lookup table similar to the translation table below:

| Translation Table | |
| --- | --- |
| Module Speed (Delay Elements) | Threshold Count |
| 07 | 50 |
| 08 | 44 |
| 09 | 39 |
| 10 | 35 |
| 11 | 32 |
| 12 | 29 |
| 13 | 27 |
| 14 | 25 |
| 15 | 23 |
| 16 | 22 |
| 17 | 21 |
| 18 | 19 |
| 19 | 18 |
| 20 | 18 |
| 21 | 17 |

From the table, it will be observed that as the module gets faster (i.e., more delay elements), the threshold required to do a phase correction decreases. In other words, since each phase correction on a fast module is smaller, a lower threshold is provided to the low pass filter 14. This allows for the same phase correction characteristics at different silicon speeds.

The DPLL shown in FIG. 1 also contains a second, slave digitally controlled oscillator (DCO) 24. This DCO receives as its reference the clock and is controlled by the phase shifted 26. The phase shifter 26 reads the module speed monitor 20 and creates a phase offset control word. This is used by the DCO 24 to create a phase offset system clock which is supplied to the retiming latch 28. The retiming latch 28 thus retimes the input data with a phase shifted version of the original clock. This design is especially useful for retiming return to zero (RZ) code but can also be used for non-return to zero (NRZ) code. One reason to use this approach with NRZ code as opposed to selecting the inverted version of the PLL clock is that the retiming clock may not have a tightly controlled duty cycle. Employing this approach removes the dependency on precise 50% duty cycles.

Figure 3:
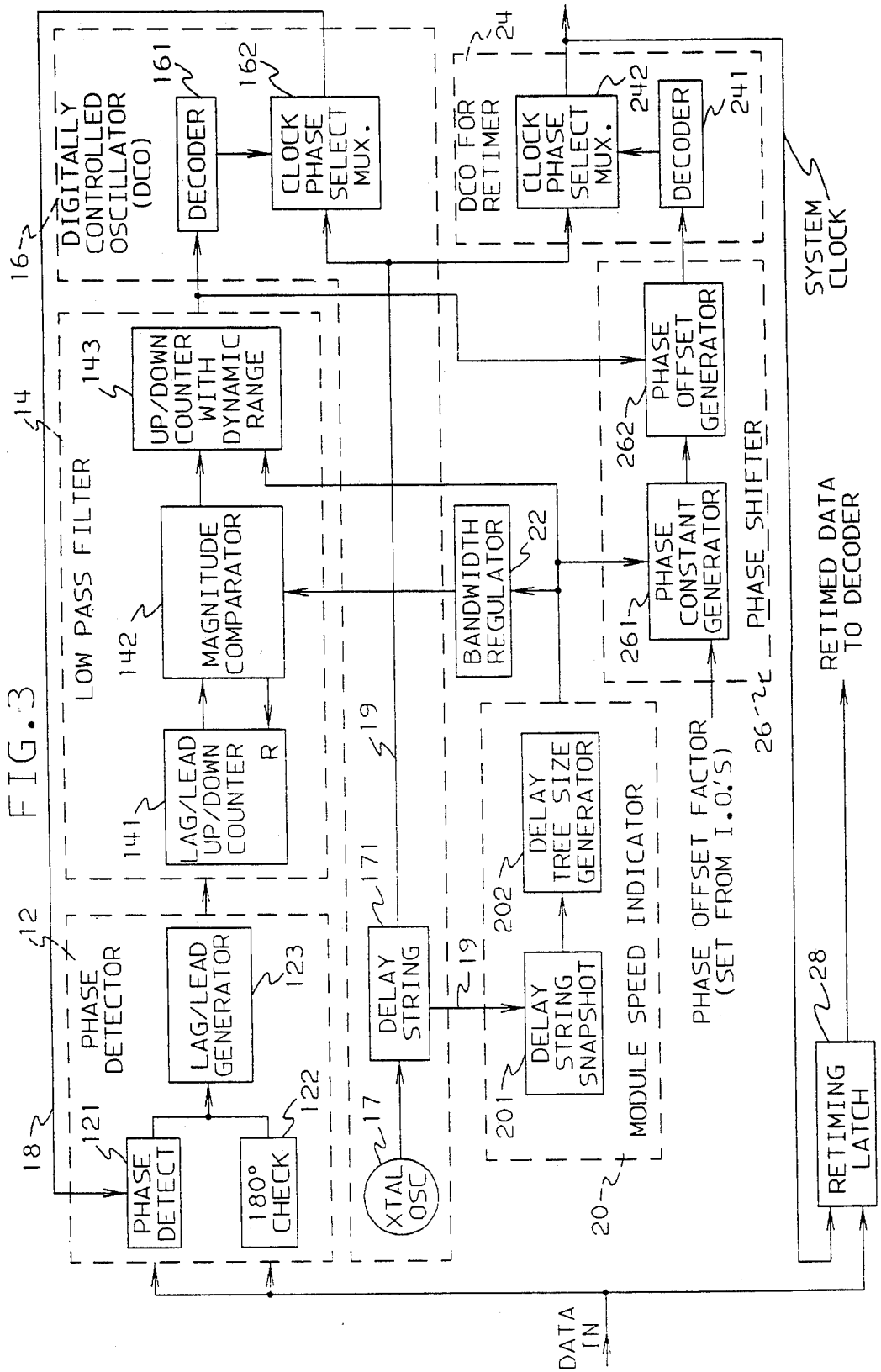
FIG. 3 is detailed block diagram showing the construction of the various elements of the DPLL shown in FIG. 1.

The block diagram shown in FIG. 3 shows in more detail one possible implementation of the invention. The phase detector 12 comprises a phase detector circuit 121 and a 180° check circuit 122, both of which receive the input data and the fed back system clock from the DCO 16. The outputs of these two circuits are supplied to a lag/lead generator 123.

The phase detector circuit 121 is a D-type latch where the clock input comes from the received data and the data input comes from the output clock of the DCO 16. A second latch is used as the check circuit 122 to help prevent the PLL from coming into lock 180° out of phase. While this is a highly unstable state, it does insure that temporary false locks are avoided such as during module power up. It also becomes more important when the low pass filter is set to a high filter level. This second latch uses the same received data as its clock input but uses a slightly delayed version (i.e., 2°-5°) of the DCO's output clock. This allows for a simple voting scheme between the two latches. If the PLL comes up 180° out of phase, the second latch will output the opposite value from what it would have, had it been in phase. These two D-type latch outputs are compared in a simple Boolean function called the lag/lead generator 123. During normal phase adjustments, the phase information of the first latch is used. Should the 180° condition appear, the lag/lead generator forces a "clock leading data" condition.

The low pass filter 14 includes an up/down counter 141 which increments for leads and decrements for lags. This input comes from the output of the phase detector 12. The counter output value is monitored by the magnitude comparator 142. The magnitude comparator monitors for when the up/down counter 141 reaches the threshold specified by the bandwidth regulator. Two conditions must be considered, a lagging threshold and a leading threshold. This is satisfied by using the original bandwidth regulator threshold value in addition to generating a two's complement of it. This function is contained in the magnitude comparator.

When the up/down counter 141 has an output value that equals the lagging threshold, the magnitude comparator 142 resets the counter and causes a second up/down counter 143 to increment. When the up/down counter 141 has an output value that equals the leading threshold, the magnitude comparator resets the counter and causes the second up/down counter 143 to decrement. The binary output of the second up/down counter 143 is the address used by the DCO 16 to select the correct clock phase. The up/down counter 143 is preconditioned by the module speed indicator 20. When the counter needs to decrement below zero, it checks what value is on the module speed indicator bus and uses that value as the new value. When the counter 143 is incrementing, it checks that the current value is not greater than the module speed indicator 20. If it is, the counter is reset to zero. In this way, a seamless phase shift wrap around point is created.

The first DCO 16 comprises a binary decoder 161 which receives the output from up/down counter 143 and provides an output to control a clock phase select multiplexer 162. The multiplexer 162 receives its input from delay string 171 driven by the crystal oscillator 17. FIG. 2 shows what the output of the delay string would look like. This delay string bus is input to the phase selection multiplexer 162 and should be wired such that each delay tap has a similar capacitive load. Care must also be taken when selecting a new phase clock. When selecting a different phase, the multiplexer 162 must change state during a stable high or low period of the clock. The decoder 161 is designed to take this into account.

The module speed monitor 20, connected to delay string 171 by delay string bus 19, measures the speed of the silicon by taking snapshots of the delay string 171 outputs and finding the last non-redundant delay element. The delay string snapshot 201 consists of a register triggered by the system clock. Each bit of the register samples a delay string output when triggered, as illustrated in FIG. 2. The delay tree size generator 202 determines the last non-redundant delay element by finding the "1" to "0" transition in the bits of the snapshot register. This transition point is output as the number of non-redundant delay string elements. The bandwidth regulator 22 uses this value to calculate the low pass filter 14 threshold required to maintain the necessary bandwidth for the current module silicon speed. As mentioned previously, the threshold calculation made by the bandwidth regulator 22 could easily be performed using a translation table.

The phase shifter 26 also receives the output of the delay tree size generator 202. More specifically, the phase constant generator 261 combines the delay tree size with the phase offset factor to create a control signal for the phase offset generator 262. This control signal represents the number of delay elements required to achieve the desired phase offset for the system clock. The phase offset generator 262 computes the delay string position of the system clock by adding the number of required delay elements output by the phase constant generator 261 to the delay string position of the phase comparison clock as indicated by the output of the up/down counter 143. The phase offset generator 262 also ensures that the selected system clock will be selected from the output of a non-redundant delay string element. The decoder 241 converts the output of the phase offset generator 262 to n selection signals, where n is the number of delay string elements and all but one of the selection signals is false. The delay string element corresponding to the true selection signal will be output by the multiplexer 242 as the system clock.

Since the required phase offset input to the phase constant generator 261 for the system clock will always be constant for a specific application, it can be specified generally and the phase shifter 26 will translate the general value into the number of required delay elements. This translation can be achieved using a lookup table of required delay elements versus delay string sizes; however, multiple tables would be required for a single design to accommodate multiple applications using different phase offsets. For example, two tables would be required to accommodate NRZ code with a 180° phase shift and RZ code with a 90° phase shift. As a more flexible approach, the phase offset can be input as a fraction of the clock period and this value multiplied by the delay string size to determine the required number of delay elements. Once the number of delay elements required to do a specific phase shift is computed, it is simply added to the pointer created by the low pass filter pointer.

Figure 4:
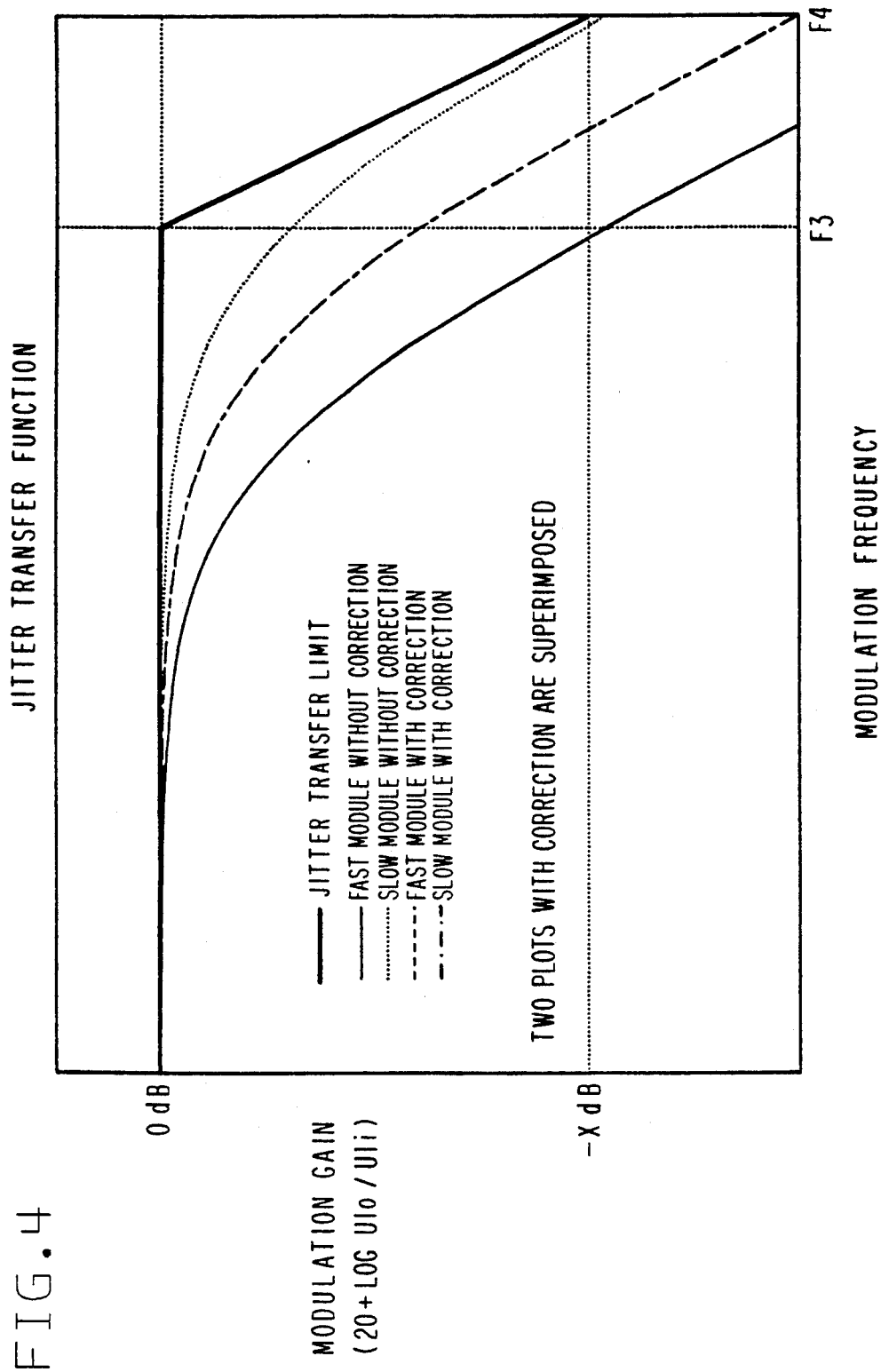
FIG. 4 is a graph showing the jitter transfer function of the DPLL according to the invention.

FIG. 4 shows a graph of jitter transfer for the DPLL according to the invention. In the graph shown in FIG. 4, the ratio between the output and input jitter amplitudes of the DPLL is represented in dB, and this ratio is plotted against the frequency of the jitter. The graph shows that for a fixed low pass filter threshold, there is a wide variation in the bandwidth of the DPLL. At high frequencies, the slow module will filter much less jitter than a fast module. However, when the low pass filter threshold is adjusted to compensate for the module silicon speed, the variation in bandwidth between fast and slow modules becomes negligible.

Figure 5:
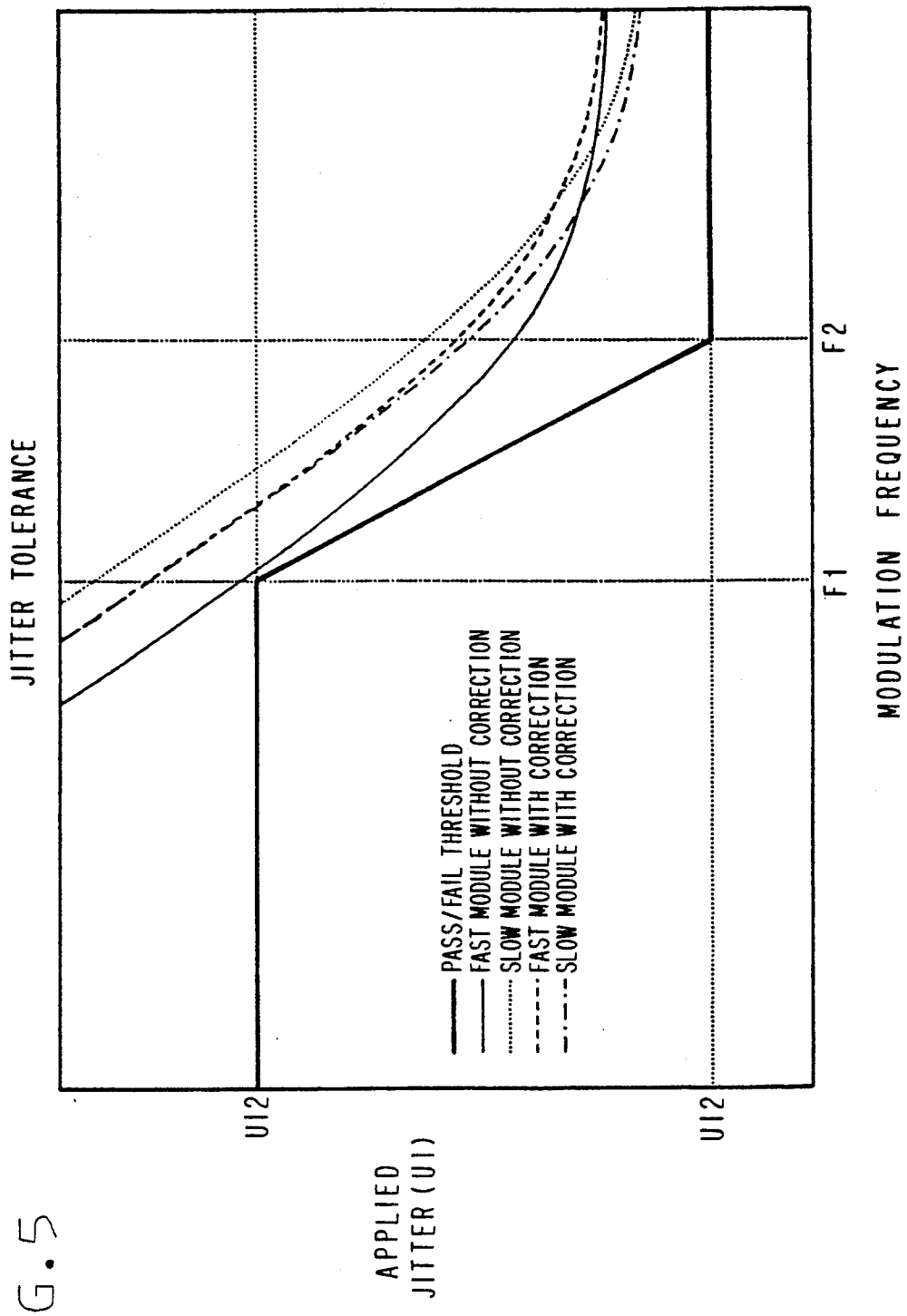
FIG. 5 is a graph showing the jitter tolerance of the DPLL according to the invention.

In the graph shown in FIG. 5, the amplitude of the phase modulated jitter is expressed in unit intervals (UI). One UI is equal to the bit period. The curves show that faster silicon cannot handle as high of a jitter amplitude at the lower frequencies. This is because each phase shift is smaller due to faster propagation delays of the delay string. Adjusting the low pass filter threshold by way of the regulator pushes the performance to the right. Note that the difference in performance at the high frequencies between fast and slow modules is due to quantization effects.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A digital phase locked loop comprising:
   a phase detector receiving input digital data at a first input, a low pass filter connected to an output of the phase detector, and a digitally controlled oscillator connected to an output of said low pass filter, an output of the digitally controlled oscillator being connected to a second input of the phase detector to form a loop with said digitally controlled oscillator generating a clock output and said phase detector comparing said clock output with input digital data;
   a delay string connected to said digitally controlled oscillator; and
   speed monitoring means responsive to said delay string for determining variations in circuit speed of the digital phase locked loop due to at least one of manufacturing and environmental conditions, said speed monitoring means generating a first control digital word used by said low pass filter to adjust dynamic characteristics of the low pass filter.

2. The digital phase locked loop recited in claim 1 further comprising bandwidth regulator means connected to receive said first control digital word from said speed monitoring means for generating a second control digital word, said low pass filter using said second control digital to set a threshold to determine when to make a phase adjustment in said digitally controlled oscillator output.

3. The digital phase locked loop recited in claim 2 further comprising:
   a second, slave digitally controlled oscillator for generating a system clock;
   programmable phase shifter means responsive to said low pass filter and said first control digital word from said speed monitoring means for controlling the frequency of said second, slave digitally controlled oscillator; and
   retiming latch means for receiving input digital data and controlled by said system clock for generating retimed digital data output.

4. The digital phase locked loop recited in claim 1 wherein said digitally controlled oscillator comprises:
   a crystal oscillator for generating a precision frequency reference signal, said delay string being connected to said crystal oscillator and outputting a plurality of precision frequency reference signals having different delays;
   clock phase select multiplexer means connected to receive said plurality of precision frequency reference signals from said delay string; and
   decoder means responsive to said low pass filter for generating a control signal for said clock phase select multiplexer means for selecting one of said plurality of precision frequency reference signals as said output of said digitally controlled oscillator.

5. The digital phase locked loop recited in claim 4 wherein said speed monitoring means comprises:
   delay string snapshot means connected to said delay string for periodically sampling a state of said delay string; and
   delay tree size generator means connected to said delay string snapshot means for determining a last non-redundant delay element in said delay string and for generating said first control digital word.

6. The digital phase locked loop recited in claim 3 wherein said digitally controlled oscillator comprises:
   a crystal oscillator for generating a precision frequency reference signal, said delay string being connected to said crystal oscillator and outputting a plurality of precision frequency reference signals having different delays;
   clock phase select multiplexer means connected to receive said plurality of precision frequency reference signals from said delay string; and
   decoder means responsive to said low pass filter for generating a control signal for said clock phase select multiplexer means for selecting one of said plurality of precision frequency reference signals as said output of said digitally controlled oscillator.

7. The digital phase locked loop recited in claim 6 wherein said speed monitoring means comprises:
   delay string snapshot means connected to said delay string for periodically sampling a state of said delay string; and
   delay tree size generator means connected to said delay string snapshot means for determining a last non-redundant delay element in said delay string and for generating said first control digital word.

8. The digital phase locked loop recited in claim 7 wherein said programmable phase shifter means comprises:
   phase constant generator means for combining said first control digital word with a phase offset factor to generate a control signal representing a number of delay elements required to achieve a desired phase offset for a sampling clock; and
   phase offset generator means responsive to said control signal from said phase constant generator means for computing a delay string position of the sampling clock by adding the number of delay elements required to a delay string position as indicated by an output of said low pass filter.

9. The digital phase locked loop recited in claim 8 wherein said second, slave digitally controlled oscillator comprises:
   second clock phase selector multiplexer means connected to receive said plurality of precision frequency reference signals from said delay string; and
   second decoder means responsive to said phase offset generator means for generating a control signal for said second clock phase select multiplexer means for selecting one of said plurality of precision frequency reference signals as said sampling clock.

10. The digital phase locked loop recited in claim 8 wherein said low pass filter comprises:
   first up/down counter means for incrementing a count in response to a lag condition output from said phase detector and for decrementing a count in response to a lead condition output from said phase detector;
   magnitude comparator means for monitoring a count accumulated by said first up/down counter means and for resetting said first up/down counter means when a count of said first up/down counter means is equal to either a lagging threshold value or a leading threshold value; and
   second up/down counter means responsive to said magnitude comparator means for incrementing a count when said first up/down counter is reset by said magnitude comparator upon said lagging threshold value being equaled by the count of said first up/down counter means and for decrementing a count when said first up/down counter is reset by said magnitude comparator upon said leading threshold value being equaled by the count of said first up/down counter means, the count accumulated by said second up/down counter means being supplied to said phase offset generator means as said delay string position.

11. The digital phase locked loop recited in claim 10 wherein said second up/down counter means is preconditioned by said speed monitoring means so that when said second up/down counter means needs to decrement below a value of zero, it checks the value of said first control digital word and uses that value as a new value, and when said second up/down counter means is incrementing, it checks said first digital control word to determine whether its current count is greater than said first digital control word and, when said current count is greater than said first digital control word, said second up/down counter is reset to zero.

12. The digital phase locked loop recited in claim 10 wherein said phase detector comprises:
   phase detector circuit means responsive to said clock output from said digitally controlled oscillator and said input digital data for providing an output signal indicative of a phase difference between said clock output from said digitally controlled oscillator and said input digital data;

180° clock circuit means responsive to a delayed version of said clock output from said digitally controlled oscillator and said input digital data for providing an output signal indicative of a phase difference between said delayed version of said clock output from said digitally controlled oscillator and said input digital data, said delayed version of said clock output being output by said digitally controlled oscillator and being a clock output having a delay; and lag/lead generator means responsive to said phase detector circuit means and said 180° clock circuit means for producing a respective lag and lead condition output and for forcing a clock leading data condition when a 180° out of phase lock condition is detected.

* * * * *